(12) United States Patent
Adachi

(10) Patent No.: US 10,970,544 B2
(45) Date of Patent: Apr. 6, 2021

(54) AUTOMATED WAREHOUSE

(71) Applicant: Murata Machinery, Ltd., Kyoto (JP)

(72) Inventor: Naruto Adachi, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 48 days.

(21) Appl. No.: 16/336,767

(22) PCT Filed: Aug. 16, 2017

(86) PCT No.: PCT/JP2017/029463
§ 371 (c)(1),
(2) Date: Mar. 26, 2019

(87) PCT Pub. No.: WO2018/066236
PCT Pub. Date: Apr. 12, 2018

(65) Prior Publication Data
US 2019/0228226 A1 Jul. 25, 2019

(30) Foreign Application Priority Data
Oct. 7, 2016 (JP) .............................. JP2016-198634

(51) Int. Cl.
*B65G 43/08* (2006.01)
*G06K 9/00* (2006.01)
(Continued)

(52) U.S. Cl.
CPC .......... *G06K 9/00664* (2013.01); *B65G 1/04* (2013.01); *B65G 1/137* (2013.01); *B65G 1/16* (2013.01);
(Continued)

(58) Field of Classification Search
CPC . B65G 1/137; B65G 1/04; B65G 1/16; B65G 2203/041; B65G 43/08;
(Continued)

(56) References Cited

U.S. PATENT DOCUMENTS

2004/0126015 A1 7/2004 Hadell
2010/0080449 A1 4/2010 Yoshioka
(Continued)

FOREIGN PATENT DOCUMENTS

CN 101712403 A 5/2010
CN 101867793 A 10/2010
(Continued)

OTHER PUBLICATIONS

Notification of Reason for Refusal dated Aug. 7, 2020, of counterpart Korean Application No. 10-2019-7009614, along with an English translation.

*Primary Examiner* — Said M Elnoubi
(74) *Attorney, Agent, or Firm* — DLA Piper LLP (US)

(57) ABSTRACT

An automated warehouse includes a plurality of transfer destinations at which articles can be placed; and a transporter that moves between the plurality of transfer destinations and that transfers the article to the transfer destination, the automated warehouse including: moving-side image capturer provided on the transporter and image-captures the transfer destination and a part or all of an operation of transferring the article to the transfer destination performed by the transporter; and a fixed-side image capturer provided at a predetermined position in the automated warehouse, and image-captures, from a direction different from that of the moving-side image capturer, the transporter and a part or all of the operation of transferring the article to the transfer destination performed by the transporter.

19 Claims, 14 Drawing Sheets

(51) Int. Cl.
*B65G 1/16* (2006.01)
*B65G 1/04* (2006.01)
*B65G 1/137* (2006.01)
*H04N 7/18* (2006.01)

(52) U.S. Cl.
CPC ........ *B65G 43/08* (2013.01); *B65G 2203/041* (2013.01); *H04N 7/188* (2013.01)

(58) Field of Classification Search
CPC .............. B65G 1/0421; B65G 2201/02; G06K 9/00664; H04N 7/188
See application file for complete search history.

(56) References Cited

U.S. PATENT DOCUMENTS

| | | | |
|---|---|---|---|
| 2011/0262004 A1 | 10/2011 | Murakami | |
| 2014/0229001 A1 | 8/2014 | Tsujita | |
| 2015/0059374 A1* | 3/2015 | Hebel | F25D 29/00 62/125 |

FOREIGN PATENT DOCUMENTS

| | | | |
|---|---|---|---|
| CN | 102105384 A | | 2/2011 |
| CN | 202503607 U | | 10/2012 |
| CN | 103826995 A | | 5/2014 |
| CN | 104944037 A | | 9/2015 |
| JP | 58-26732 A | | 2/1983 |
| JP | 2-95605 A | | 4/1990 |
| JP | 6-40507 A | | 2/1994 |
| JP | 06040507 A | * | 2/1994 |
| JP | 10-338497 A | | 12/1998 |
| JP | 11-301811 A | | 11/1999 |
| JP | 11301811 A | * | 11/1999 |
| JP | 2004-182451 A | | 7/2004 |
| JP | 2005-94080 A | | 4/2005 |
| JP | 2005-239357 A | | 9/2005 |
| JP | 2007-230707 A | | 9/2007 |
| JP | 2011-223193 A | | 11/2011 |
| JP | 2015-64656 A | | 4/2015 |

* cited by examiner

AUTOMATED WAREHOUSE

TECHNICAL FIELD

This disclosure relates to an automated warehouse.

BACKGROUND

In manufacturing factories such as semiconductor manufacturing factories, articles such as transportation containers (FOUPs) for semiconductor wafers and reticle pods for transporting reticles are temporarily stored. The automated warehouse includes a transporter such as a stacker crane, and the transporter transfers articles to a storage rack, an incoming/outgoing port or the like. It has been proposed that to confirm articles that have been transferred to a storage rack, the presence of the articles on each storage rack is confirmed by acquiring images (video images) of the articles with a television camera provided on the transporter and the acquired images are used for stock management purposes (for example, see Japanese Unexamined Patent Application, First Publication No. H02-95605).

The transporter used for an automated warehouse is controlled to place articles at predetermined positions on a storage rack. However, sometimes, an abnormality is detected due to some cause and the transporter may be stopped as a result. Therefore, confirmation of transfer operation is required.

In view of the above circumstances, there is a need to easily confirm a transfer operation of a transporter from a plurality of directions.

SUMMARY

I thus provide:

An automated warehouse includes a plurality of transfer destinations at which articles can be placed and a transporter that moves between the plurality of transfer destinations and transfers the article to the transfer destination, the automated warehouse comprising: a moving-side image capturer provided on the transporter and that image-captures the transfer destination and a part or all of an operation of transferring the article to the transfer destination performed by the transporter; and a fixed-side image capturer provided at a predetermined position in the automated warehouse, and that image-captures, from a direction different from those of the moving-side image capturer, the transporter and a part or all of the operation of transferring the article to the transfer destination performed by the transporter.

There may be included a display that displays a motion image or a still image captured by at least one of the moving-side image capturer and the fixed-side image capturer. The display may be capable of simultaneously displaying, in a side-by-side manner, motion images or still images captured by the moving-side image capturer and the fixed-side image capturer. There may be included a recorder that records a motion image or a still image captured by at least one of the moving-side image capturer and the fixed-side image capturer. The motion image or the still image may be associated with a time of image-capturing and may be recorded in the recorder. There may be included a display controller that extracts, from the recorder, a motion image or a still image within predetermined time ranges before and after a specified time that is specified by a controller controlling the automated warehouse or by an inputter, and causes the display to display the motion image or the still image. The moving-side image capturer may be supported on an elevation platform lifted or lowered while having the article placed thereon, and may image-capture the transfer destination from diagonally above. There may be included an illuminator provided on the elevation platform and that illuminates the transfer destination when the moving-side image capturer performs image-capturing. The fixed-side image capturer may be arranged on an upper side of the automated warehouse and on a traveling end side of the transporter, and may image-capture, from diagonally above, an interior of the automated warehouse including the transporter.

It is thus possible to easily confirm a transfer operation from a plurality of directions.

In the automated warehouse that includes a display that displays a motion image or a still image captured by at least one of the moving-side image capturer and the fixed-side image capturer, since the motion image or the still image is displayed, it is possible to easily confirm the transfer operation by the moving image or the still image. In the automated warehouse that is capable of simultaneously displaying, in a side-by-side manner, motion images or still images captured by the moving-side image capturer and the fixed-side image capturer, since the motion images or the still images captured from a plurality of directions are simultaneously displayed in the side-by-side manner, it is possible to easily confirm the transfer operation by the motion images or the still images. In the automated warehouse that includes a recorder that records a motion image or a still image captured by at least one of the moving-side image capturer and the fixed-side image capturer, it is possible to reliably confirm the transfer operation by confirming the motion image or the still image. In the automated warehouse in which the motion image or the still image is associated with a time of image-capturing and recorded in the recorder, it is possible to efficiently process or confirm image data recorded in the recorder on the basis of a chronological order thereof. In the automated warehouse that includes a display controller that extracts, from the recorder, a motion image or a still image within predetermined time ranges before and after a specified time that is specified by a controller controlling the automated warehouse or the inputter, and that causes the display to display the motion image or the still image, it is possible to easily confirm image data within the predetermined time ranges. In the automated warehouse in which the moving-side image capturer is supported on the elevation platform lifted or lowered while having the article placed thereon, and image-captures the transfer destination from diagonally above, since image-capturing is performed from near the article being transferred, it is possible to reliably image-capture the transfer operation by the moving-side image capturer. In the automated warehouse that includes an illuminator provided on the elevation platform and illuminates the transfer destination when the moving-side image capturer performs image-capturing, since the illuminator reliably illuminates the transfer destination, it is possible to accurately capture the transfer destination by the moving-side image capturer. In the automated warehouse in which the fixed-side image capturer is arranged on an upper side of the automated warehouse and on a traveling end side of the transporter, and image-captures, from diagonally above, an interior of the automated warehouse including the transporter, since the fixed-side image capturer is installed on the upper end side of the automated warehouse and performs image-capturing from diagonally above, it is possible to efficiently image-capture a wide range in the automated warehouse.

DESCRIPTION OF REFERENCE SIGNS

S, SA Automated warehouse
1 Transporter
2 Article
4 Storage rack (transfer destination)
8, 8a, 8b Fixed-side image capturer
12 Elevation platform
13 Transferer
14, 14a to 14d Moving-side image capturer
15, 15a to 15d Illuminator
34 Display
35 Inputter
36 Recorder
37, 37A Controller
40 Display controller
Im1, Im2 Image (motion image or still image)
T0 Specified time

DETAILED DESCRIPTION

The following describes examples with reference to the drawings. In the following drawings, an XYZ coordinate system is used to describe the directions in each drawing. In the XYZ coordinate system, the vertical direction is taken as the Z direction, and the horizontal directions are taken as the X direction and the Y direction. Also, in each of the X, Y, and Z directions, the side pointed by arrow is referred to as the + side (for example, +X side) and the opposite side thereof is referred to as the – side (for example, –X side) as appropriate.

First Example

Figure 1:
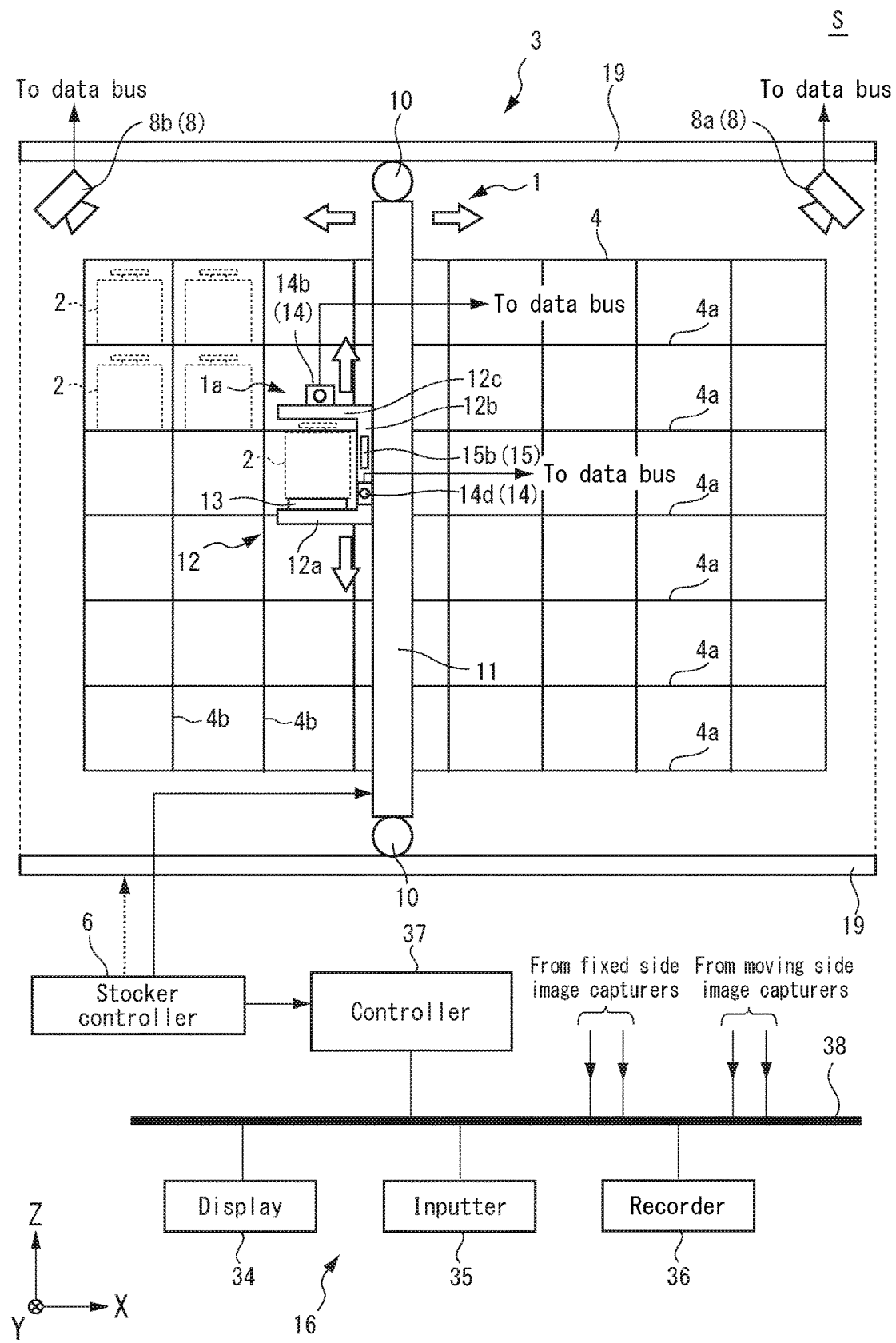
FIG. 1 is a front elevation view conceptually showing an example of an automated warehouse.
Figure 2:
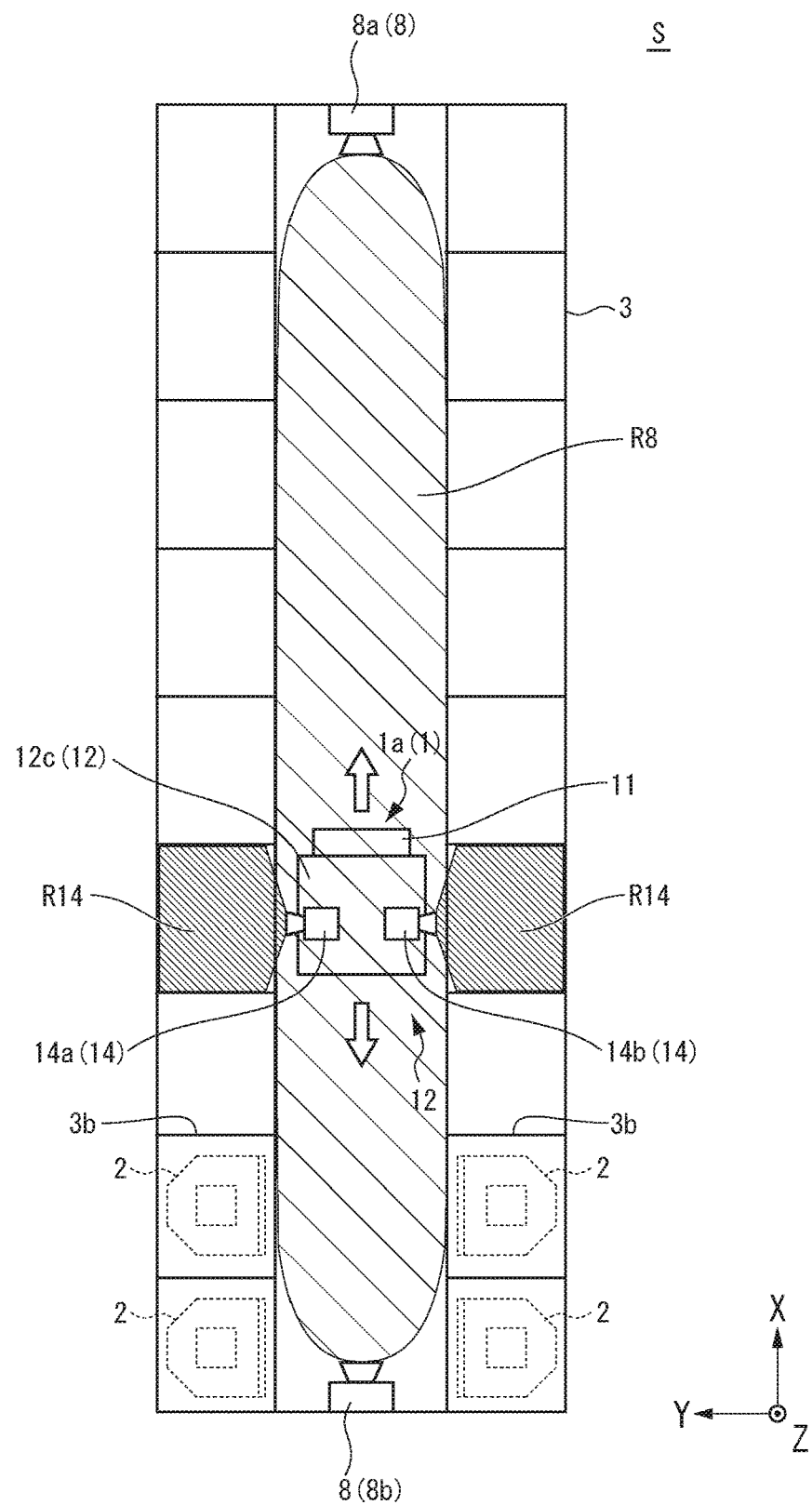
FIG. 2 is a top view showing the automated warehouse of FIG. 1.
Figure 3:
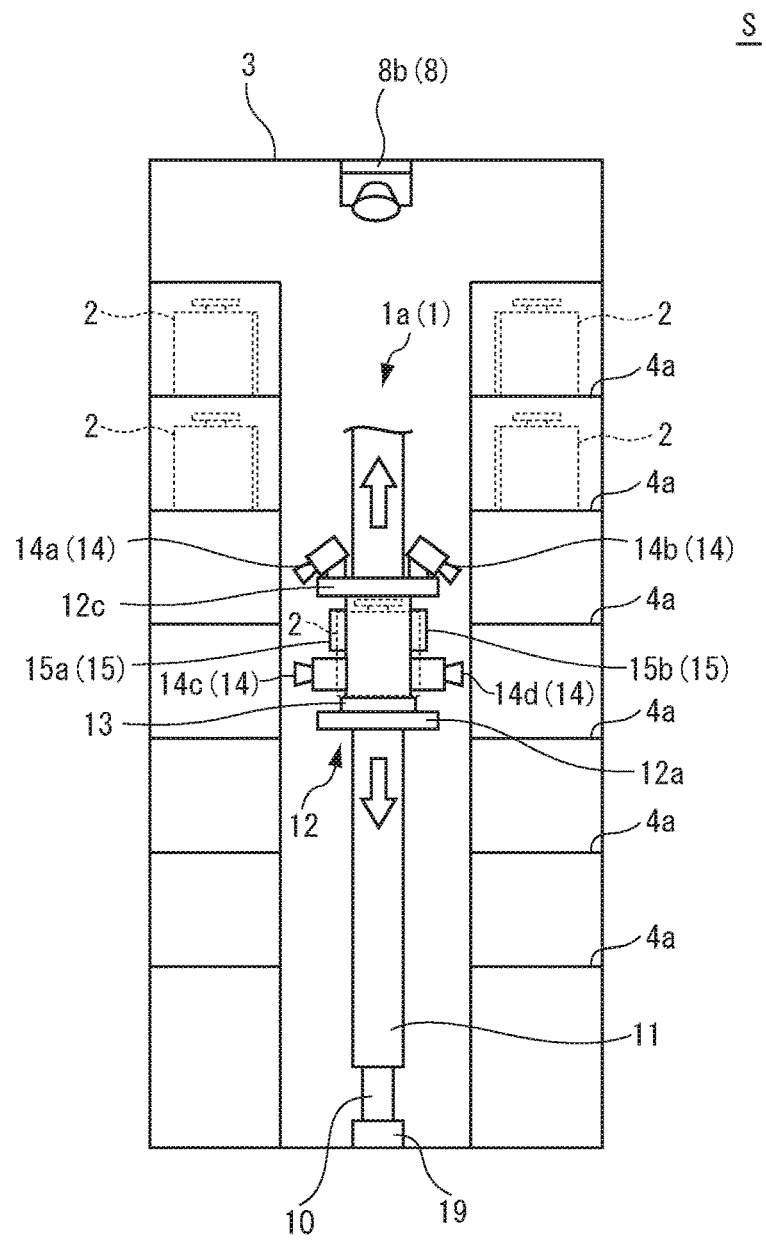
FIG. 3 is a top view showing the automated warehouse of FIG. 1.
Figure 3:
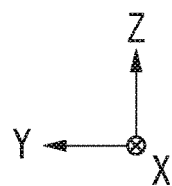

FIGS. 1 to 3 are diagrams conceptually showing an example of an automated warehouse. FIG. 1 is a front elevation view as seen from the –Y side. FIG. 2 is a top view as seen from the +Z side. FIG. 3 is a side view as seen from the –X side. An automated warehouse S (stocker) includes a transporter 1. The transporter 1 is a stacker crane. The automated warehouse S is, for example, installed in a semiconductor manufacturing factory and stores articles 2 examples of which include a container such as a FOUP accommodating semiconductor wafers and a reticle pod accommodating a processing member such as a reticle.

The transporter 1 moves between a plurality of transfer destinations at which articles 2 can be placed, and transfers the article 2 to the transfer destination. The transporter 1 includes a main body 1a that moves between the plurality of transfer destinations. The X direction in the figure is a direction in which the transporter 1 moves, and the Y direction is a direction in which the transporter 1 delivers or receives the article 2. The transporter 1 is assumed to be a stacker crane, however, the transporter 1 need not be a stacker crane. In addition, the article 2 is described as a FOUP, however, the article 2 need not be a FOUP. For example, the article 2 may be various kinds of articles handled at a facility where the automated warehouse S is installed. Also, the transporter 1 and the automated warehouse S can be applied to facilities of fields other than the semiconductor field.

The automated warehouse S includes the transporter 1, a housing 3, storage racks 4 (transfer destinations), a stocker controller 6, moving-side image capturers 14, fixed-side image capturers 8, and a manager 16. The transporter 1 will be described later. The housing 3 has an internal space that can be isolated from the outside. The housing 3 includes an incoming/outgoing port (not shown in the figures) through which the articles 2 are transferred between the outside of the housing 3 and the internal space.

The storage racks 4 are arranged inside the housing 3. The storage rack 4 (see FIG. 2) is provided in a plurality of positions, and arranged on both sides (+Y side and –Y side) of a direction (Y direction) intersecting the moving direction (X direction) of the transporter 1. Each storage rack 4 has a plurality of racks 4a arranged in a vertical direction (Z direction) and a plurality of vertical plates 4b arranged in a horizontal direction (X direction) (see FIG. 1). On each rack 4a there can be placed an article 2. Also, on each rack 4a there can be placed a plurality of articles 2.

The stocker controller 6 controls and manages respective parts of the automated warehouse S including the transporter 1. The stocker controller 6, for example, controls operation of each part of the transporter 1 and manages storage history of the articles 2 on the storage racks 4. The stocker controller 6 is arranged outside the housing 3. The stocker controller 6 is configured with a computer device including a CPU, a memory storage device such as a main memory and a hard disk, a wired or wireless communication device, an input device such as a keyboard or a mouse, and a display device such as a display. The computer device reads various programs stored in the memory storage device and executes processes according to the programs. The stocker controller 6 connects to the respective parts of the automated warehouse S to be capable of communicating therewith in a wired or wireless manner. Also, the stocker controller 6 connects to a controller 37 of a manager 16 to be capable of communicating therewith in a wired or wireless manner. The stocker controller 6 may be arranged inside or outside the housing 3.

The transporter 1 is arranged inside the housing 3. The transporter 1 travels along tracks 19 and transfers the articles 2. The transporter 1 includes the main body 1a, a transferer 13, the moving-side image capturers 14, the illuminators 15. The main body 1a includes traveling bodies 10, a mast 11, and an elevation platform 12.

The traveling bodies 10 travel along the tracks 19. The tracks 19 are provided in an upper part and a lower part within the housing 3. The upper and lower tracks 19 are both provided between the storage racks 4 on the +Y side and the −Y side (not shown in the figure). The upper and lower tracks 19 are each arranged in a direction parallel to the X direction. The traveling bodies 10 travel in a direction substantially parallel to the tracks 19 (in the X direction in FIG. 1). The traveling bodies 10 each have a traveling driver such as an electric motor, a speed reducer, a drive wheel, an encoder and the like. The drive wheel is arranged to be in contact with the track 19, and connects to an output axis of the electric motor (the traveling driver) via the speed reducer. Rotation of the output axis of the electric motor is transmitted to the drive wheel via the speed reducer, and rotation of the drive wheel drives the traveling body 10 to travel. The encoder detects the rotation speed of the output axis of the electric motor and outputs the detection result to a controller. The controller controls rotation of the electric motor on the basis of detection results of the encoder and controls the speed or the stop position of the traveling bodies 10. Setting the stop position of the traveling bodies 10 may be performed by identifying an indicator plate or the like preliminarily installed along the tracks 19. Moreover, the traveling driver (the electric motor) may be a rotary type motor, and may be a linear motor.

Between the upper traveling body 10 and the lower traveling body 10 there is attached a mast 11 extending vertically (in the Z direction). The mast 11 moves integrally with the upper traveling body 10 and the lower traveling body 10.

The elevation platform 12 ascends or descends along the mast 11. The elevation platform 12 includes a base 12a, a strut 12b, and a top plate 12c. The base 12a is arranged under the elevation platform 12. The base 12a supports each part of the elevation platform 12. The strut 12b is arranged on the +X side of the base 12a. The strut 12b extends vertically upward from the base 12a. The strut 12b connects, on the +X side thereof, to the mast 11 via a connector (not shown in the figures). The elevation platform 12 is guided in the vertical direction by the mast 11. The top plate 12c is arranged above the elevation platform 12. Between the base 12a and the top plate 12c there is formed a space in which the article 2 can be placed. The top plate 12c is supported from below by the strut 12b. The top plate 12c is used to support objects such as the moving-side image capturers 14 and prevent the article 2 from falling off.

The elevation platform 12 is suspended from above by suspenders such as wires or the like. The transporter 1 includes a lift driver that drives the suspenders. The lift driver feeds out or winds up the suspenders. When the lift driver winds up the suspenders, the elevation platform 12 is lifted by being guided by the mast 11. Also, when the lift driver feeds out the suspenders, the elevation platform 12 is lowered by being guided by the mast 11. The configuration of the elevation platform 12 is not limited to the example of FIG. 1 and is optional. For example, the elevation platform 12 need not include the top plate 12c.

Figure 4:
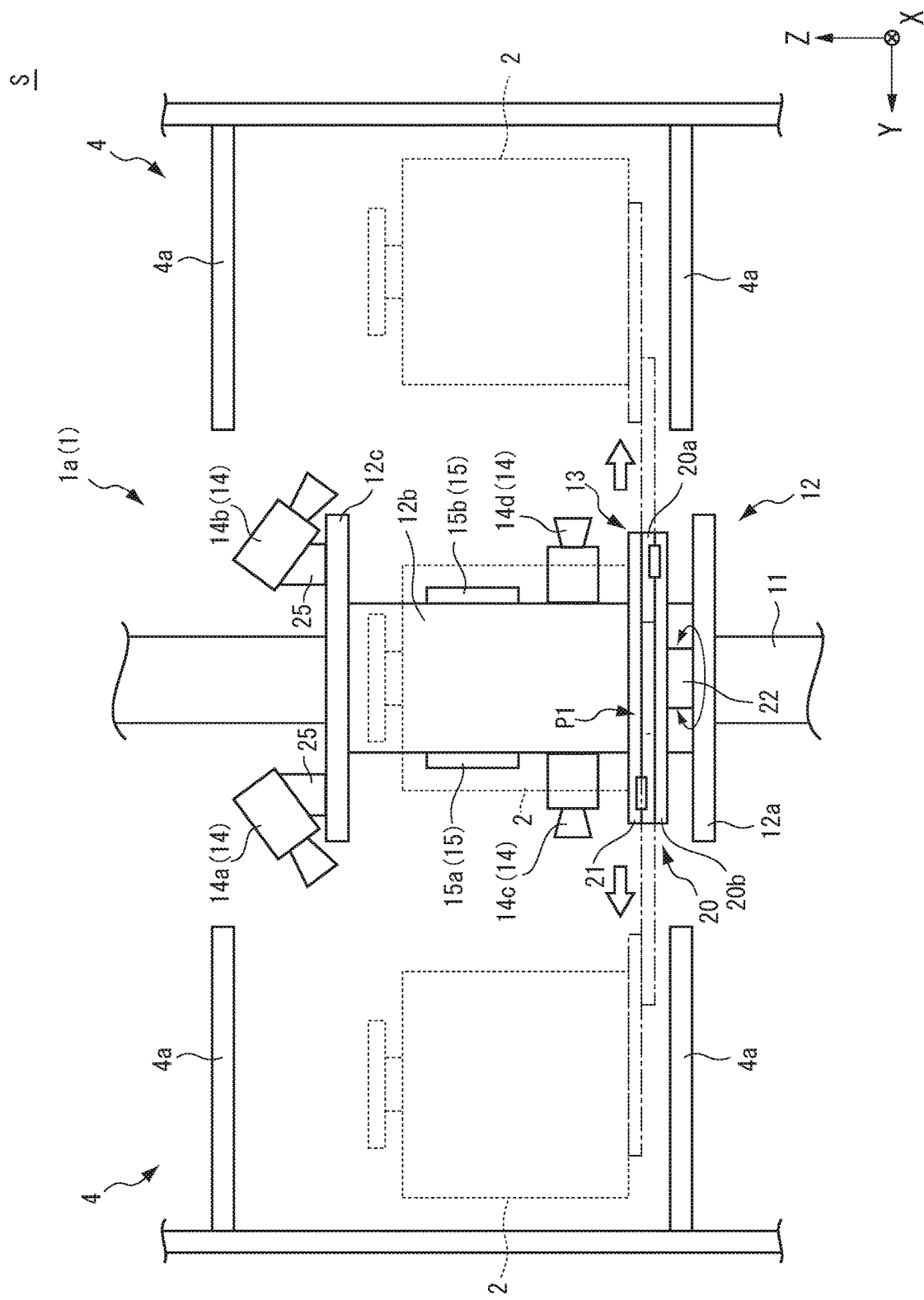
FIG. 4 is a side view showing an elevation platform and a transferer.
Figure 5:
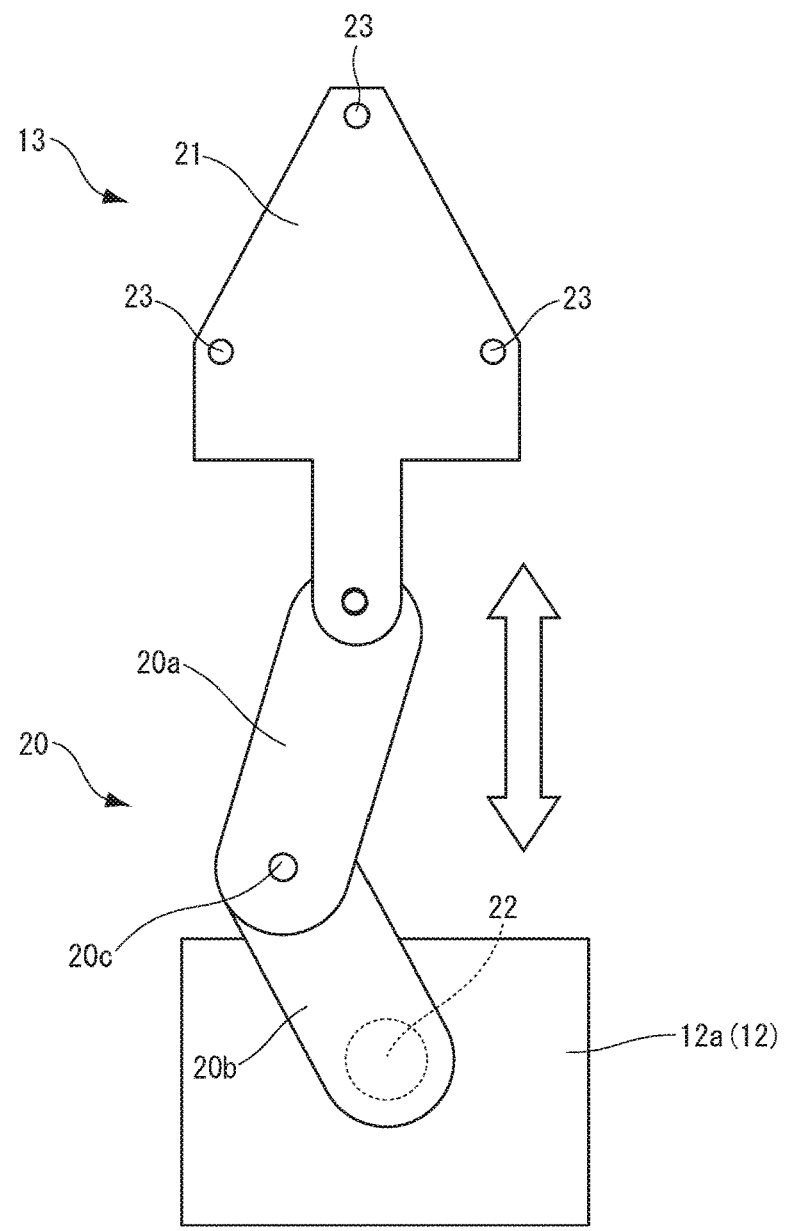
FIG. 5 is a top view showing an arm.

The transferer 13 is provided in the main body 1a and moves between a plurality of transfer destinations as the main body 1a moves. The transferer 13 is provided on the elevation platform 12. FIG. 4 is a side view showing the elevation platform 12 and the transferer 13 as seen from the −X side. The transferer 13 includes an arm 20, a holder 21, and a rotation driver 22. FIG. 5 is a top view of the arm 20 as seen from the +Z side. The arm 20 is of a structure in which arms 20a, 20b connect via a joint 20c. The arm 20 can extend and retract in a horizontal direction that includes the Y direction as the arms 20a, 20b bend at the joint 20c. A proximal end side of the arm 20 connects to the rotation driver 22.

The holder 21 rotatably connects to a distal end side of the arm 20a. The holder 21 can hold the article 2 on an upper surface thereof. The holder 21 has a plurality of (for example, three) pins 23 (for example, kinematic pins) used to position the article 2. A plurality of grooves for positioning are radially formed on a bottom surface of the article 2. When the holder 21 holds the article 2, the plurality of pins 23 of the holder 21 each enter the grooves on the bottom surface of the article 2, and thereby position the article 2 on the upper surface of the holder 21. The holder 21 supports the article 2 in the state where the article 2 is positioned. The rotation driver 22 is arranged on the elevation platform 12 and rotates the arm 20 and the holder 21 about an axis parallel to the vertical direction.

As shown in FIG. 4, the holder 21 is arranged on the elevation platform 12 in a state where the arm 20 is retracted. The position of the arm 20 and the holder 21 in such a state is referred to as waiting position P1. When the transferer 13 transfers the article 2 to the storage rack 4, the holder 21 is positioned at the waiting position P1 in the state of holding the article 2. Then, the arm 20 of the transferer 13 extends from the waiting position P1 to either the +Y side or the −Y side. The extending direction of the arm 20 is changed to the +Y side or to the −Y side by rotation of the rotation driver 22. When delivering the article 2 to a transfer destination, the transferer 13 extends the arm 20 in a state of having been positioned with respect to the transfer destination, and positions the article 2 on the holder 21 above the transfer destination. Then, by lowering the elevation platform 12, the article 2 is delivered to the transfer destination from the holder 21. As seen from above, the transferer 13 places the article 2 at the transfer destination in the state of the arm 20 having been extended toward the transfer destination on the +Y side or the −Y side. Moreover, after the having delivered the article 2, the arm 20 is retracted and the holder 21 is positioned at the waiting position P1. As seen from above, the transferer 13 (the holder 21) is provided to be freely movable forward and backward with respect to the transfer destination from the main body 1a.

When the transferer 13 receives the article 2 from a transfer origin such as the storage rack 4, the holder 21 is positioned at the waiting position P1 in the state of not holding the article 2. The arm 20 then extends toward the article 2 placed at the transfer origin, and the holder 21 is positioned below the bottom surface of the article 2. Then, in the transferer 13, the holder 21 picks up the article 2 as the elevation platform 12 is lifted. Then, in the transferer 13, the arm 20 is retracted with the article 2 being held on the holder 21, the arm 20 and the holder 21 are moved to the waiting position P1, and the article 2 is held on the elevation platform 12. As described above, the transferer 13 is capable, from the waiting position P1, of extending toward the transfer destination in the state of holding the article 2 on the distal end thereof (holder 21), and places the article 2 at the transfer destination in the state of having extended toward the transfer destination. According to such type of configuration of the transferer 13, the transferer 13 can be made in a compact size.

The transferer 13 shown in FIG. 1 is merely an example, and may be of another configuration. For example, the transferer 13 may grasp a flange 2c provided on the upper part of the article 2 (see FIG. 8) to hold the article 2, or may sandwich sides of the article 2 to hold the article 2. Moreover, the transferer 13 is not limited to use of the arm 20 described above and, for example, an articulated robot arm or the like may be used therefor.

Next, the moving-side image capturers 14 will be described. As shown in FIG. 1, the moving-side image capturers 14 are provided on the main body 1a and move between the plurality of transfer destinations as the main body 1a moves. The moving-side image capturers 14 are provided on the elevation platform 12. The moving-side image capturers 14 image-capture the transfer destination and a part or all of an operation of transferring the article 2 to the transfer destination performed by the transporter 1. The moving-side image capturers 14 are image capturing devices such as a camera and a video camera. Here, the description is based on the assumption that the moving-side image capturers 14 are the image capturing devices. The moving-side image capturers 14 are, for example, digital cameras (digital video cameras) that acquire images or motion images as digital data. The moving-side image capturers 14 may each include an auto focusing mechanism, a zooming mechanism, a flash and the like.

As shown in FIG. 4, the moving-side image capturers 14 include a plurality of moving-side image capturers 14a to 14d. The moving-side image capturer 14a is provided on the +Y side of the top plate 12c. The moving-side image capturer 14a is oriented toward the +Y side and image-captures the +Y side from the top plate 12c. The moving-side image capturer 14b is provided on the −Y side of the top plate 12c. The moving-side image capturer 14b is oriented toward the −Y side and image-captures the −Y side from the top plate 12c. The moving-side image capturer 14c is provided on the −Y side of the strut 12b. The moving-side image capturer 14c is oriented toward the +Y side and image-captures the +Y side from the strut 12b. The moving-side image capturer 14d is provided on the −Y side of the strut 12b. The moving-side image capturer 14d is oriented toward the −Y side and image-captures the −Y side from the strut 12b.

The moving-side image capturers 14 shown in FIG. 4 are merely an example, and may be of another configuration. For example, the number of the moving-side image capturer 14a, the number of the moving-side image capturer 14b, the number of the moving-side image capturer 14c, and the number of moving-side image capturer 14d are not limited to one, but may be two or more. Also, the number of the moving-side image capturer 14a and the number of the moving-side image capturer 14b may be different from each other. It is sufficient that at least one moving-side image capturer 14 is provided on each of the +Y side and the −Y side of the elevation platform 12. For example, among the moving-side image capturers 14, either one of the set of the moving side image capturers 14a, 14b and the set of the moving side image capturers 14c, 14d may be omitted.

Figure 6:
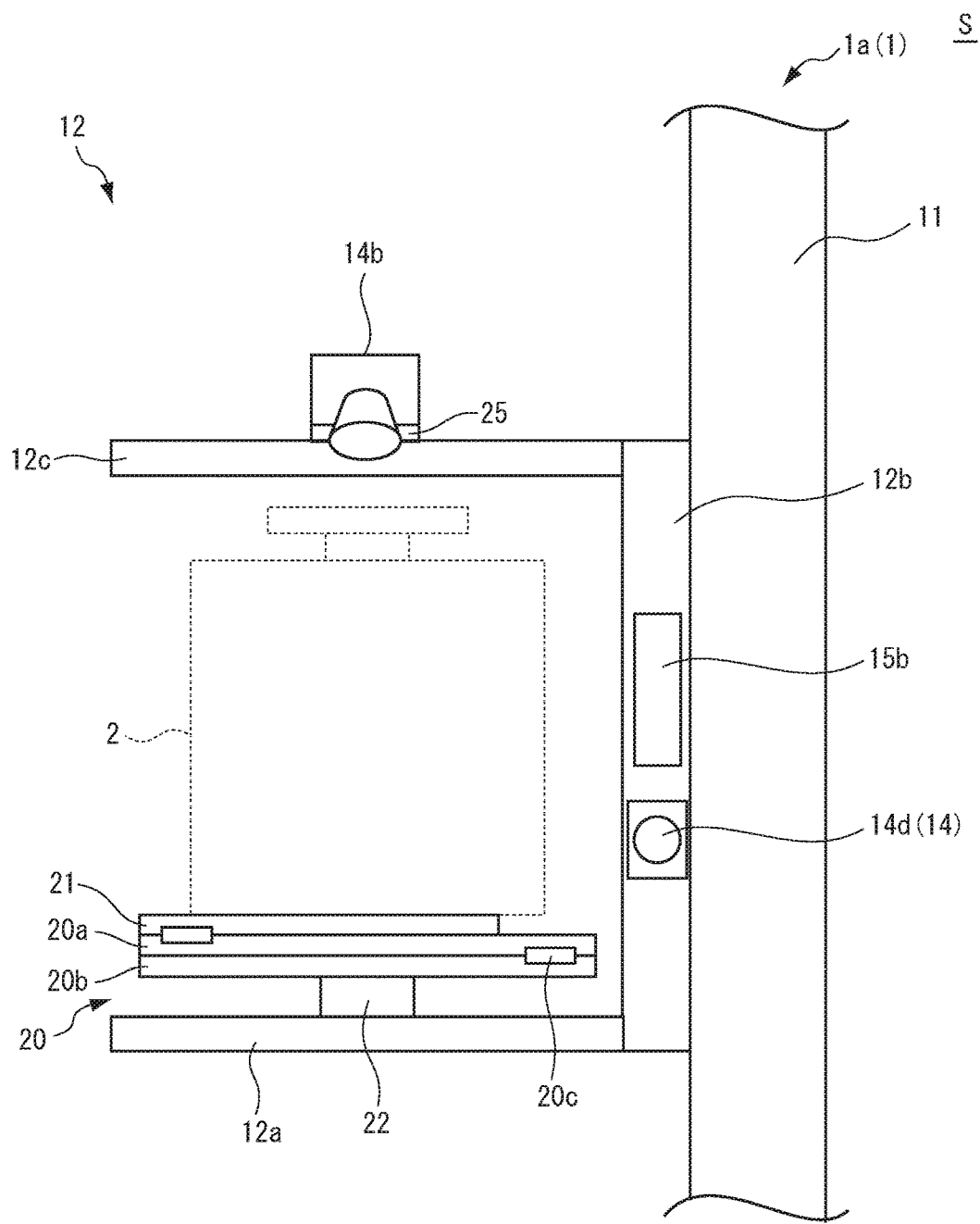
FIG. 6 is a front elevation view showing the elevation platform and moving-side image capturers.

FIG. 6 is a front elevation view of the elevation platform 12 and the moving-side image capturers 14 as seen from the −Y side. The moving-side image capturer 14b is provided on the top plate 12c via a support member 25. Also, the moving-side image capturer 14b is supported on the support member 25 to be oriented diagonally downward at a predetermined angle, and performs image-capturing from diagonally above. Thereby, the moving-side image capturer 14b becomes able to image-capture the storage rack 4 and the transfer operation of the transferer 13 to transfer the article 2 to the storage rack 4 (hereinafter, simply referred to as "transfer operation"). With such a configuration, the moving-side image capturer 14b can reliably image-capture the storage rack 4 and the transfer operation.

The moving-side image capturer 14d is provided on the strut 12b. The moving-side image capturer 14b is oriented in the horizontal direction, on the side orthogonal to the traveling direction (the X direction) (on the storage rack 4 side, or on the −Y side in FIG. 6). As a result, the moving-side image capturer 14d is able to image-capture the storage rack 4 and the transfer operation. With such a configuration, the moving-side image capturer 14d can reliably image-capture the storage rack 4 and the transfer operation. The moving-side image capturers 14 (14a to 14d) image-capture an interior R14 of the storage rack 4 (see FIG. 2) in a state, for example, where the main body 1a is stopped at a position where the article 2 can be transferred to the storage rack 4 by the transferer 13.

The moving-side image capturers 14a, 14b are not limited to the postures described above and, for example, may be oriented in the horizontal direction. Moreover, the moving-side image capturers 14c, 14d are not limited to the postures described above and, for example, may be oriented diagonally upward (image-capturing may be performed from diagonally below), or may be oriented diagonally downward (image-capturing may be performed from diagonally above). Also, the moving-side image capturers 14a, 14d may each be of a configuration in which a driving device changes the posture thereof. In such an example, the postures of the moving-side image capturers 14a to 14d may be set by controlling driving of the driving device by operation instructions from the stocker controller 6 or the manager 16.

As shown in FIG. 4, the illuminators 15 include a plurality of illuminators 15a, 15b. The illuminator 15a is provided on the +Y side of the strut 12b. The illuminator 15a is oriented toward the +Y side of the strut 12b and illuminates the +Y side from the strut 12b. The illuminator 15b is provided on the −Y side of the strut 12b. The illuminator 15b is oriented toward the −Y side and illuminates the −Y side from the strut 12b. The number of the illuminator 15a and the number of the illuminator 15b are each not limited to one, but may be two or more. Also, the number of the illuminator 15a and the number of the illuminator 15b may be different from each other. The illuminators 15a, 15b are not limited to the postures described above and, for example, may be oriented diagonally upward (illumination may be performed from diagonally below), or may be oriented diagonally downward (illumination may be performed from diagonally above).

As shown in FIG. 6, the illuminator 15b is arranged in the vicinity of the moving-side image capturer 14b. The illuminator 15b illuminates the transfer destination when the moving-side image capturers 14 perform image-capturing. A light emitting element such as an LED is used for the illuminator 15b. The illuminator 15b is oriented toward the direction in which the moving-side image capturers 14 perform image-capturing (toward the −Y side in FIG. 6). The illuminator 15b is arranged to illuminate the article 2 placed at the transfer destination at a predetermined angle (in the horizontal direction in FIG. 6). The illuminator 15b connects to the stocker controller 6 to be able to communicate therewith. In the illuminator 15b, the ON/OFF timing of illumination, the intensity of illumination light and the like are controlled by the stocker controller 6.

In FIG. 6, the moving-side image capturers 14b, 14d and the illuminator 15b on the −Y side are shown. However, the moving-side image capturers 14a, 14c and the illuminator 15a on the +Y side (see FIG. 4) are also configured in the same manner as that of the moving-side image capturers 14b, 14d and the illuminator 15b. As described above, when the moving-side image capturers 14 perform image-capturing, the illuminators 15 reliably illuminate the transfer destination and the article 2 placed at the transfer destination and, as a result, the moving-side image capturers 14 can accurately image capture the transfer destination and the article 2 placed at the transfer destination. Whether or not the transporter 1 includes the illuminators 15a, 15b is optional.

Next, image-capturing performed by the moving-side image capturers 14a to 14d will be described. The moving-side image capturers 14a to 14d image-capture the transfer destination and a part or all of the transfer operation.

Figure 7:
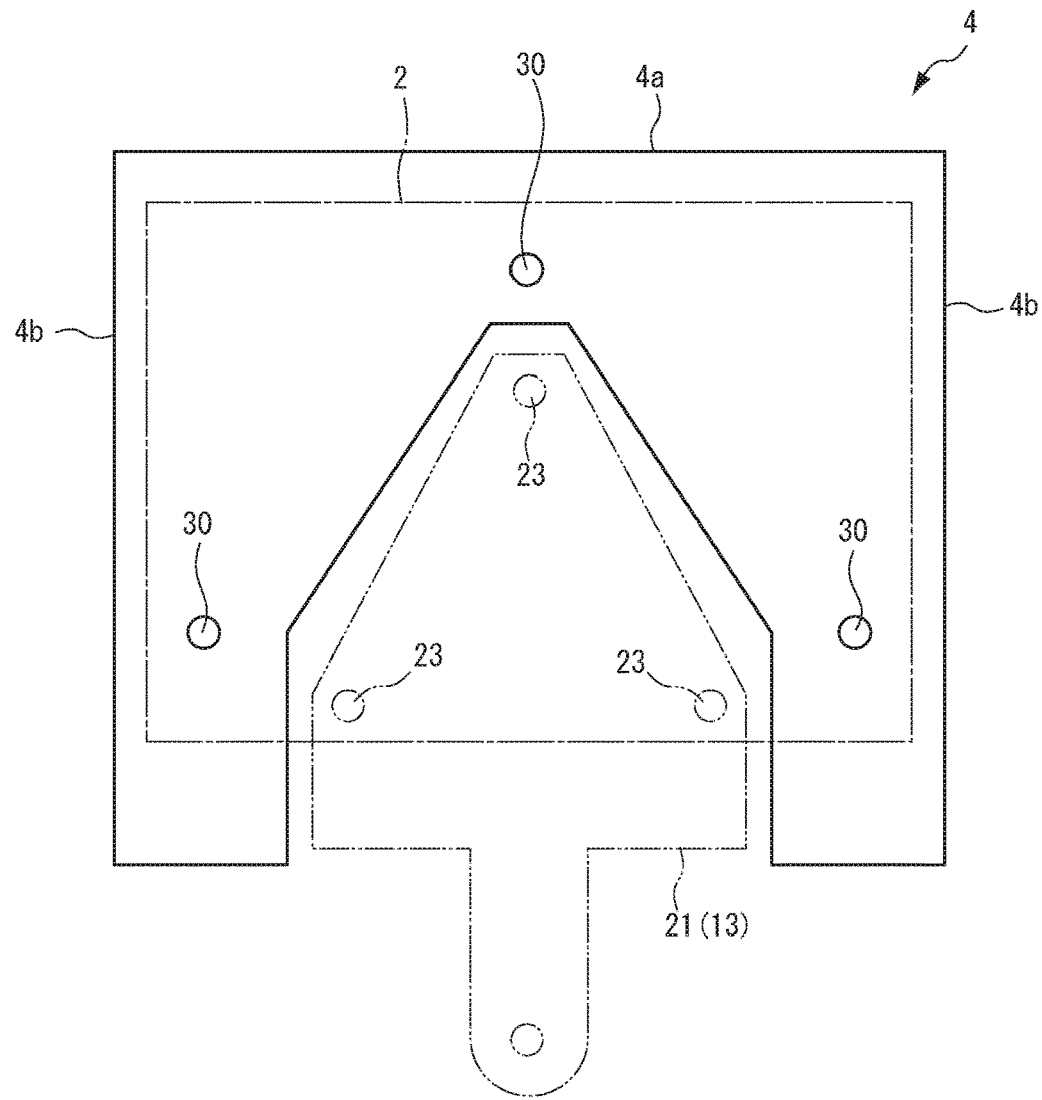
FIG. 7 is a top view showing an enlarged view of a part of a storage rack.

First, the structure of the storage rack 4, which is the transfer destination, and the transfer operation will be described. FIG. 7 is a top view showing an enlarged view of a part of the storage rack 4. In the storage rack 4a, for each portion for placing a single article 2 thereon, there are provided a plurality of (for example, three) pins 30, and a cutout 32. The plurality of pins 30 are, for example, kinematic pins and used to position the article 2. The plurality of pins 30 are provided at predetermined positions on the rack 4a, respectively. The cutout 32 allows the holder 21 of the transferer 13 to pass therethrough in the vertical direction. The cutout 32 is formed in a shape larger than the holder 21 when viewed from above to avoid contact with the holder 21 when the holder 21 passes therethrough. When the article 2 is transferred to the storage rack 4 by the transferer 13, the holder 21 moves downward from above the cutout 32 to perform the transfer operation of the article 2. The plurality of pins 30 provided on the rack 4a are inserted into positioning grooves (not shown in the figure) in the bottom surface of the article 2, and the article 2 is thereby positioned on the rack 4a. The article 2 is placed on the rack 4a in the state of being positioned.

Figure 8:
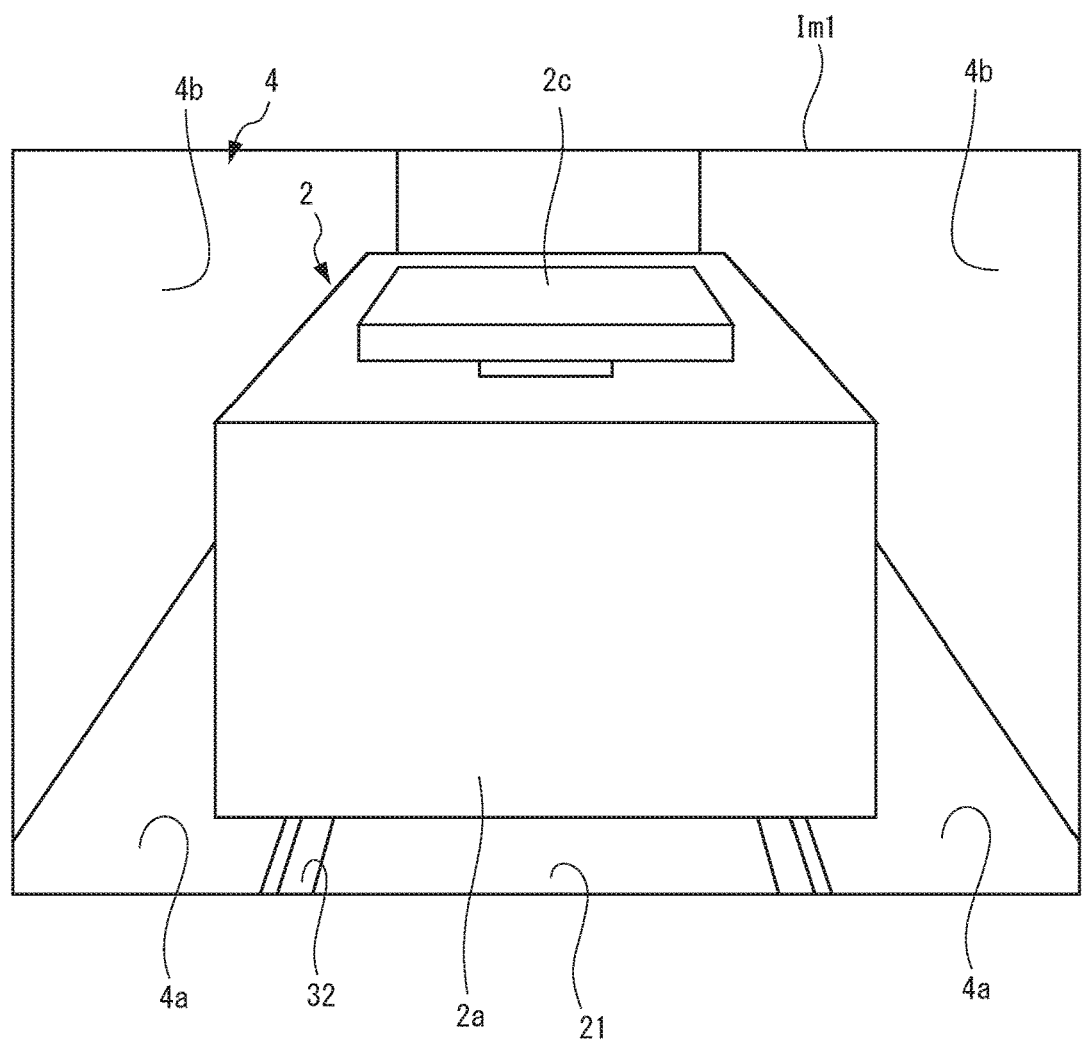
FIG. 8 is a diagram showing an example of an image of a transfer destination captured by the upper moving-side image capturer.

FIG. 8 is a diagram showing an example of an image of the transfer destination captured by the upper moving-side image capturer 14b. FIG. 8 shows an image Im1 of a part of a motion image captured by the moving-side image capturer 14b. The article 2 has a main body 2a capable of accommodating semiconductor wafers therein, and a flange 2c provided at an upper part of the main body 2a. The moving-side image capturer 14b image-captures a range in the storage rack 4 from the near side (the −Y side in FIG. 8) including the cutout 32 to the far side (the +Y side). As shown in FIG. 8, the moving-side image capturer 14b image-captures the entire front surface (the −Y side surface) and the upper surface (the +Z side surface) of the article 2 placed on the storage rack 4a, and the holder 21 being inserted in the cutout 32 and performing the transfer operation. Since the moving-side image capturer 14b performs image-capturing from diagonally above, image-capturing can be performed over a wide range. While FIG. 8 shows image-capturing performed by the moving-side image capturer 14b on the −Y side, the moving-side image capturer 14a on the +Y side also performs image-capturing in the same manner as that of the moving-side image capturer 14b on the −Y side.

Figure 9:
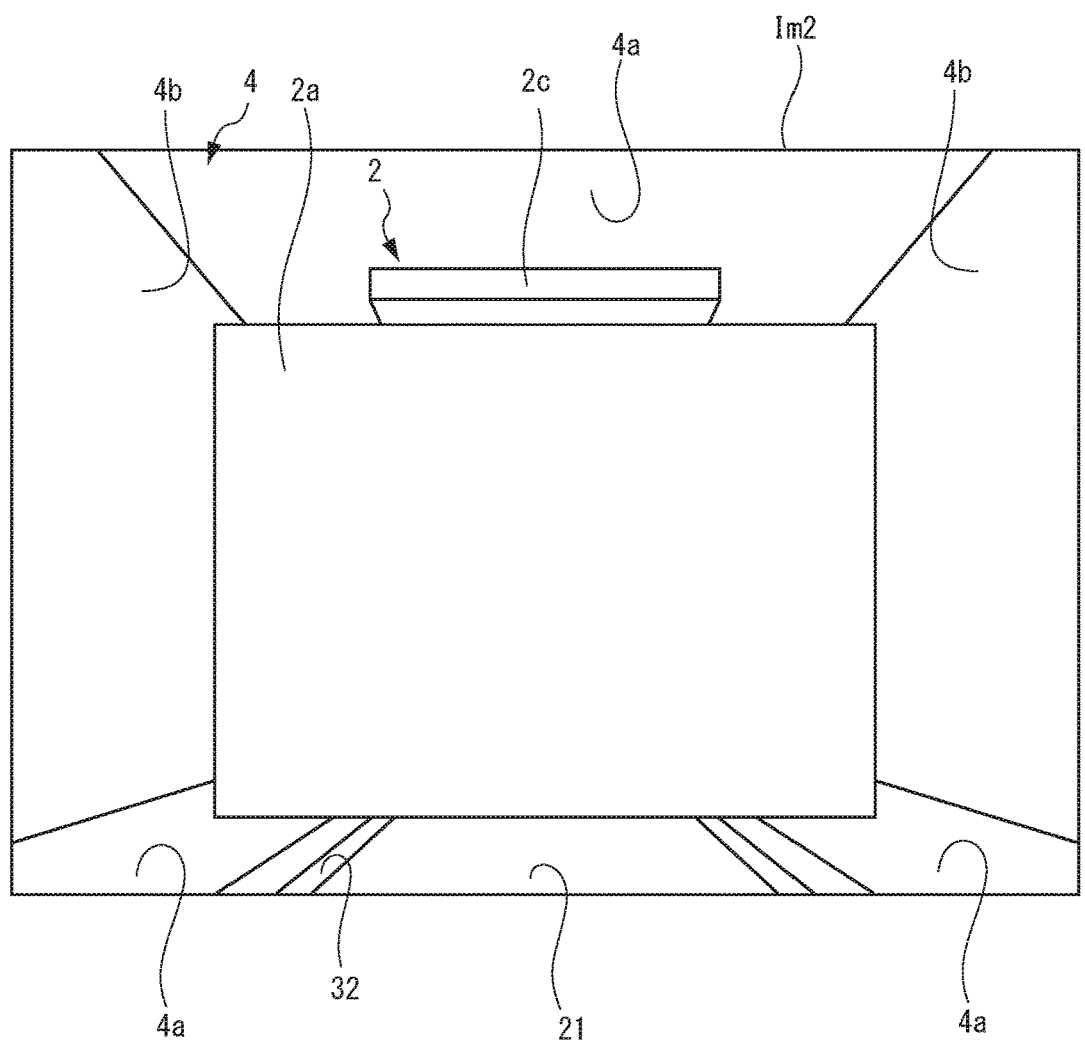
FIG. 9 is a diagram showing an example of an image of a transfer destination captured by the lower moving-side image capturer.

FIG. 9 is a diagram showing an example of an image of the transfer destination captured by the lower moving-side image capturer 14d. FIG. 9 shows an image Im2 of a part of a motion image captured by the moving-side image capturer 14d. FIG. 9 is an image of a state of the article 2 shown in FIG. 8 captured by the moving-side image capturer 14d.

The moving-side image capturer 14d image-captures a range in the storage rack 4 from the near side (the −Y side in FIG. 8) including the cutout 32 to the far side (the +Y side) including the top surface (the surface on the +Z side).

As shown in FIG. 8, the moving-side image capturer 14b image-captures the article 2 or the like placed on the storage rack 4a from diagonally above. On the other hand, the moving-side image capturer 14d image-captures the article 2 or the like in the horizontal direction. In image-capturing in the horizontal direction, it is possible to easily confirm the transfer operation and inclination of the transferred article 2 with respect to the horizontal direction. As shown in FIGS. 8 and 9, it is possible to easily confirm the transfer operation and transfer state of the article 2 by performing image-capturing from the different directions between the moving-side image capturer 14b and the moving-side image capturer 14d. While FIG. 9 describes image-capturing performed by the moving-side image capturer 14d on the −Y side, the moving-side image capturer 14c on the +Y side also performs image-capturing in the same manner as that of the moving-side image capturer 14d on the −Y side. Thus, the moving-side image capturers 14 (14a to 14d) image-capture the transfer destination and a part or all of the operation of transferring the article 2 to the transfer destination performed by the transporter 1. Moreover, as described above, when the moving-side image capturers 14 are supported on the elevation platform 12 and image-capture the transfer destination from diagonally above, the image-capturing is performed from the vicinity of the article 2 being transferred so that the moving-side image capturers 14 can reliably image-capture the transfer destination. The ranges of image-capturing shown in FIGS. 2, 8, and 9, performed by the moving-side image capturers 14 (14a to 14d) are mere examples and can be set optionally.

As shown in FIG. 1, the moving-side image capturers 14a to 14d individually connect to the data bus 38. The moving-side image capturers 14a to 14d each capture motion images while the automated warehouse S is in operation. The moving-side image capturers 14a to 14d each output data of the acquired images (motion images) (hereinafter, referred to as "image data") to the data bus 38. The controller 37 performs control so that the image data output respectively from the plurality of moving-side image capturers 14a to 14d are recorded in the recorder 36 and displayed on the display 34. Also, the controller 37 performs control so that the image data output from the moving-side image capturers 14a to 14d are each associated with a time of image-capturing when recorded in the recorder 36.

Next, the fixed-side image capturers 8 in FIG. 1 will be described. The fixed-side image capturers 8 are provided at predetermined positions in the automated warehouse S (in the housing 3). The fixed-side image capturers 8 perform image-capturing to include the transferer 13. The fixed-side image capturers 8 each image-capture, from a direction different from those of the moving-side image capturers 14 (14a to 14d), the transporter 1 and a part or all of the operation of transferring the article 2 to the transfer destination performed by the transporter 1.

The fixed-side image capturers 8 include a plurality of fixed-side image capturers 8a, 8b. The fixed-side image capturers 8a, 8b are respectively arranged at a +X side end part and a −X side end part, which are on the upper side of the automated warehouse S and the traveling end sides of the transporter 1. The fixed-side image capturers 8a, 8b each image-capture, from diagonally above, the interior of the automated warehouse S including the transporter 1. The fixed-side image capturers 8a, 8b are each oriented downward and inward from the traveling end side of the transporter 1. The fixed-side image capturers 8a, 8b are, for example, digital cameras (digital video cameras) that acquire images or motion images as digital data.

Figure 10:
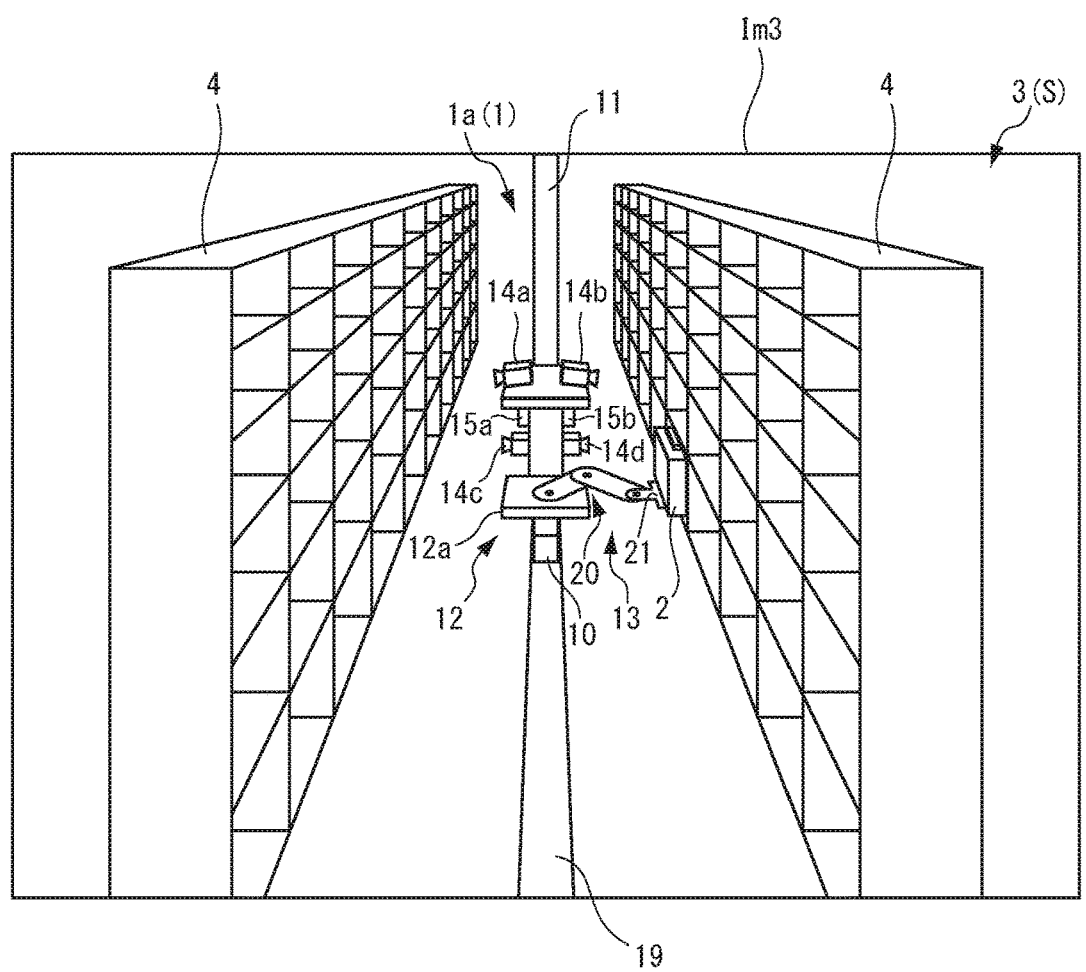
FIG. 10 is a diagram showing an example of an image captured by a fixed-side image capturer.
Figure 10:
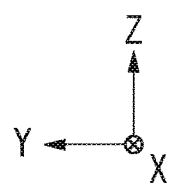

FIG. 10 is a diagram showing an example of an image captured by the fixed-side image capturer 8*b* on the −X side. FIG. 10 shows an image Im3 being a part of a motion image captured by the fixed-side image capturer 8*b*. FIG. 10 is an image captured by the fixed-side image capturer 8*b* showing a state of the article 2 shown in FIGS. 8 and 9.

The fixed-side image capturer 8*b* image-captures a region R8 from the floor surface to a height above the respective storage racks 4, from the −X side to the +X side of the two rows of the storage racks 4 on the +Y side and the −Y side (see FIG. 2). As shown in FIG. 10, the fixed-side image capturer 8*b* image-captures substantially the entire storage racks 4, the track 19 on the lower side, and substantially the entire transporter 1, from diagonally above (from the −YZ side). Since the fixed-side image capturer 8*b* performs image-capturing from diagonally above, it is possible to efficiently image-capture a wide range in the automated warehouse. The fixed-side image capturer 8*b* image-captures the transfer destination and a part or all of the operation of transferring the article 2 to the transfer destination performed by the transporter 1, from a direction different from those of the moving-side image capturers 14. The fixed-side image capturer 8*b* image-captures from the proximal end (the +Y side in FIG. 10) to the distal end (the −Y side in FIG. 10) of the arm 20 of the transferer 13, the holder 21 that holds the article 2, and the storage rack 4 of the transfer destination. Thus, the fixed-side image capturer 8*b* image-captures the transfer operation from a direction different from those of the moving-side image capturers 14*a* to 14*d* shown in FIGS. 8 and 9. The proximal end portion of the transferer 13 is not shown in the images captured by the moving-side image capturers 14*a* to 14*d* shown in FIGS. 8 and 9. However, as shown in FIG. 10, the fixed-side image capturer 8*b* performs image-capturing to include the proximal end portion of the transferer 13 performing the transfer operation.

As described above, during operation of transferring the article 2 to the transfer destination performed by the transferer 13, the fixed-side image capturers 8 can image-capture the operation from a start point to a halfway point of extending the arm 20, but in some instances, may not clearly image-capture the operation from the halfway point to an end point (end of the transfer operation) of extending the arm 20. Moreover, as shown in FIGS. 8 and 9, during the operation of transferring the article 2 to the transfer destination performed by the transferer 13, the moving-side image capturers 14 do not image-capture the operation from the start point to the halfway point of extending the arm 20, but do image-capture the operation from the halfway point to the end point (end of the transfer operation) of extending the arm 20. Also, as shown in FIGS. 8 and 9, the moving-side image capturers 14*a* to 14*d* image-capture the holder 21, which is a difficult portion for the fixed-side image capturer 8*b* to image-capture clearly. As described above, in the automated warehouse S, by using images (motion images) captured by both the fixed-side image capturers 8 and the moving-side image capturers 14, it is possible to totally confirm, from multiple angles (directions), the sequence of the transfer operation performed by the transferer 13.

As described above, in the automated warehouse S, it is possible to image-capture the transfer operation from multiple directions by the moving-side image capturers 14 (14*a* to 14*d*) and the fixed-side image capturers 8 (8*a*, 8*b*). As a result, the transfer operation can be easily and accurately confirmed. While FIG. 10 describes image-capturing performed by the fixed-side image capturer 8*b* on the −X side, the fixed-side image capturer 8*a* on the +X side also performs image-capturing in the same manner as that of the fixed-side image capturer 8*b* on the −X side. The ranges of image-capturing shown in FIGS. 2 and 10 performed by the fixed-side image capturers 8*a*, 8*b* are mere examples and can be set optionally.

The transporter 1 used for an automated warehouse S is controlled to place articles 2 at predetermined positions on the storage rack 4, however, in some instances, an abnormality is detected due to some cause and the transporter 1 may be stopped as a result. When the transporter 1 is stopped, the operator would enter the automated warehouse S to check the situation and stop the operation of the automated warehouse S, resulting in the reduced production efficiency of the manufacturing factory or the like. Therefore, it is required to promptly identify the cause of the stoppage of the transporter 1 and restore operation of the stopped transporter as soon as possible. Stopping the transporter 1 is often caused by an abnormality that arises when the transporter 1 transfers articles 2 to transfer destinations. However, in addition to transfer of articles 2, various causes are possible, including a foreign object being present in the automated warehouse S, or the transporter 1 colliding with an article 2 hanging out from the storage rack 4 to the area above the traveling track of the transporter 1. As shown in FIG. 10, in the automated warehouse S, the fixed-side image capturers 8 (8*a*, 8*b*) perform image-capturing over a wide range within the automated warehouse S including the transfer operation. Therefore, my system can be used to find the cause of the stoppage of the transporter 1 that occurs in the automated warehouse S.

As shown in FIG. 1, the fixed-side image capturers 8*a*, 8*b* individually connect to the data bus 38. The fixed-side image capturers 8*a*, 8*b* each capture motion images while the automated warehouse S is in operation. The fixed-side image capturers 8*a*, 8*b* each output data of the acquired images to the data bus 38. The controller 37 performs a controlling action so that the image data output respectively from the plurality of fixed-side image capturers 8*a*, 8*b* are recorded in the recorder 36 and displayed on the display 34. Also, the controller 37 performs control so that the image data output from the fixed-side image capturers 8*a*, 8*b* are each associated with a time of image-capturing when recorded in the recorder 36.

As described above, in the automated warehouse S, when the transferer 13 transfers the article 2 to the transfer destination (during the transfer operation), the moving-side image capturers 14 image-capture the transferer 13 transferring the article 2 and the article 2 being transferred. Moreover, the fixed-side image capturers 8 each image-capture the transferer 13 transferring the article 2 and the article 2 being transferred, from an angle (a direction) different from those of the moving-side image capturers 14. As a result, in the automated warehouse S, it is possible to totally confirm, from multiple angles (directions), the sequence of the transfer operation performed by the transferer 13.

At least one or all of the fixed-side image capturers 8*a*, 8*b* (the respective fixed-side image capturers 8) and the moving-side image capturers 14*a* to 14*d* (the respective moving-side image capturers 14) need not capture motion images while the automated warehouse S is in operation. For example, at least one or all of the respective fixed-side image capturers 8 and the respective moving-side image capturers 14 may capture a motion image or a still image at predetermined intervals or at predetermined timings. For example, during the transfer operation, at least one or all of the respective moving-side image capturers 14 may capture a motion image or a still image, or at least one or all of the respective fixed-side image capturers 8 and the respective moving-side image capturers 14 may capture a still image every one second. Also, at least one or all of the respective fixed-side image capturers 8 and the respective moving-side image capturers 14 may perform predetermined image processing on the image data and may output the processed image data to the data bus 38. For example, at least one or all of the respective fixed-side image capturers 8 and the respective moving-side image capturers 14 may output data in which the image data have undergone an image process such as a gray-scale process, or may output data in which the image data have undergone a compression process such as a lossless compression process and a lossy compression process.

The image data acquired by at least one or all of the respective fixed-side image capturers 8 and the respective moving-side image capturers 14 need not be recorded in the recorder 36. For example, at least one or all of the respective fixed-side image capturers 8 and the respective moving-side image capturers 14 may store the image data in a recording device (for example, a hard disk or a memory) included in the moving-side image capturers 14a to 14d, or on a recording medium (for example, a CD, a DVD, or a tape). In such an instance, the image data need not be recorded in the recorder 36. Furthermore, the automated warehouse S may be of a configuration that displays the image data on the display 34 without recording it in the recorder 36, or a configuration that does not record the image data in the recorder 36 nor display it on the display 34.

Moreover, the image data need not be associated with a time of image-capturing when recorded in the recorder 36. For example, at least one or all of the respective fixed-side image capturers 8 and the respective moving-side image capturers 14 may record the image data in the recorder 36 without associating it with a time of image-capturing.

Whether or not to associate the image data with a time of image-capturing when recording it in the recorder 36 is optional. Also, whether or not to display the image data on the display 34 is optional. For example, the automated warehouse S may be of a configuration of recording the image data in the recorder 36 and not displaying it on the display 34.

The manager 16 shown in FIG. 1 processes and manages the image data output from the respective fixed-side image capturers 8 and the respective moving-side image capturers 14. Also, the manager 16 performs a controlling action of the stocker controller 6. The manager 16 is controlled by the stocker controller 6.

The manager 16 is arranged outside the housing 3. The manager 16 includes a display 34, an inputter 35, the recorder 36, the controller 37, and the data bus 38 used to transmit data of the respective parts. The display 34, the inputter 35, the recorder 36, and the controller 37 each connect to the data bus 38 and mutually exchange data. The manager 16 is configured with a computer device including a CPU, a memory storage device such as a main memory and a hard disk, a wired or wireless communication device, an input device such as a keyboard or a mouse, and a display device such as a display. The computer device reads various programs stored in the memory storage device and executes processes according to the programs. The stocker controller 6 may also serve as a part of or the entire manager 16. The manager 16 may be arranged inside or outside the housing 3.

The display 34 is, for example, a liquid crystal display or the like, and displays various types of information under the control of the controller 37. The display 34 displays a motion image or a still image (image data) captured by at least one of the fixed-side image capturers 8 and the moving-side image capturers 14. The display 34 can simultaneously display, in a side-by-side manner, image data captured by the respective fixed-side image capturers 8 and the respective moving-side image capturers 14 (hereinafter, referred to as "image data captured by respective image capturers"). The display 34 may be composed of a plurality of liquid crystal displays. For example, the display 34 can simultaneously display the image data captured by the respective image capturers in the side-by-side manner, using the plurality of liquid crystal displays. Also, the display 34 can simultaneously display the image data captured by the respective image capturers in the side-by-side manner, using a single liquid crystal display. The display 34 switches and displays the image data captured by the respective image capturers under the control of the controller 37 on the basis of operation instructions input from the inputter 35. Thus, when the display 34 displays the image data captured by the respective image capturers, a motion image or a still image is displayed on the display 34, and it is therefore possible to easily confirm the image data. Moreover, when the display 34 is capable of simultaneously displaying the image data captured by the respective image capturers, the display 34 simultaneously displays motion images or still images in the side-by-side manner, and it is therefore possible to easily confirm the image data. Whether or not the display 34 simultaneously displays the image data captured by the respective image capturers in the side-by-side manner is optional. Also, whether or not the manager 16 includes the display 34 is optional.

The inputter 35 is an input device such as a keyboard and a mouse, and inputs various types of information including operation instructions of the respective parts to the manager 16. Whether or not the manager 16 includes the inputter 35 is optional.

The recorder 36 is, for example, a memory storage device such as a hard disk, and records various types of data. Recording (storing) of various types of data in the recorder 36 is performed under the control of the control of the controller 37. The recorder 36 records, under the control of the controller 37, motion images or still images (image data) captured by at least one of the fixed-side image capturers 8 and the moving-side image capturers 14. Thus, the recorder 36 records the image data captured by at least one of the fixed-side image capturers 8 and the moving-side image capturers 14, and thereby the image data can be stored and the image data can be reconfirmed easily and reliably. Whether or not the recorder 36 is included is optional.

The controller 37 controls the respective parts and performs processing of various types of data. The controller 37 performs control so that the image data captured by the respective image capturers are recorded in the recorder 36. The controller 37 may perform a controlling action so that the image data captured by the respective image capturers are temporarily recorded in the recorder 36 for a predetermined period of time. The controller 37 may perform a controlling action so that the image data captured by the respective image capturers are each associated with a time of image-capturing performed by each image capturer, to be temporarily recorded in the recorder 36 for a predetermined period of time. For example, the controller 37 may also perform a controlling action so that the time of temporarily recording the image data in the recorder 36 is associated as a time of image-capturing performed by each image capturer, and the data are recorded in the recorder 36. The controller 37 may perform a controlling action so that specific data among the temporarily recorded data are recorded for a long-term period. The controller 37 may perform a controlling action so that all of the image data captured by the respective image capturers are recorded in the recorder 36 for a long-term period, or so that the image data captured by the respective image capturers are not recorded in the recorder 36.

The controller 37 may perform a controlling action so that the temporarily recorded image data captured by the respective image capturers (temporary record data) are deleted from the recorder 36 when a certain period of time (for example, one week) has passed from the time of recording in the recorder 36. The above control suppresses the amount of data recording by recording only predetermined data for a long-term period because the recorder 36 can record a limited amount of data. Further, the controller 37 may perform a controlling action so that the temporary record data are recorded in the recorder 36 as long-term record data, on the basis of a predetermined condition. The controller 37 may perform a controlling action so that the long-term record data will not be deleted from the recorder 36 even when a certain period of time has passed from the time of recording. If the predetermined condition is determined as being met where a signal indicating an abnormality in the automated warehouse S (hereinafter, referred to as "abnormality signal") has been transmitted or where a long-term recording instruction input in the inputter 35 (hereinafter, referred to as "recording instruction") has been transmitted, the controller 37 may perform a controlling action so that the temporary record data are recorded in the recorder 36 for a long-term period. If the predetermined condition is determined as being met, the controller 37 may perform a controlling action so that the predetermined data are recorded in the recorder 36 for a long-term period. As a result, when an abnormality occurs in the automated warehouse S, the image data captured by the respective image capturers are recorded in the recorder 36 for a long-term period. Also, when an abnormality occurs in the automated warehouse S, operating personnel such as the operator may, on the display 34, display and confirm the long-term record data recorded in the recorder 36. Thus, when the image data are associated with a time of image-capturing when recorded in the recorder 36, it is possible to efficiently process or confirm the image data on the basis of a chronological order thereof.

The controller 37 may perform a controlling action so that the image data captured by the respective image capturers, the temporary record data, or the long-term record data are displayed on the display 34. The controller 37 may also perform a controlling action on the basis of the operation instruction input in the inputter 35 so that the image data captured by the respective image capturers, the temporary record data, or the long-term record data are displayed on the display 34. Also, the controller 37 may perform a controlling action so that the image data captured by the respective image capturers, the temporary record data, or the long-term record data are displayed in the side-by-side manner on the display 34.

Figure 11:
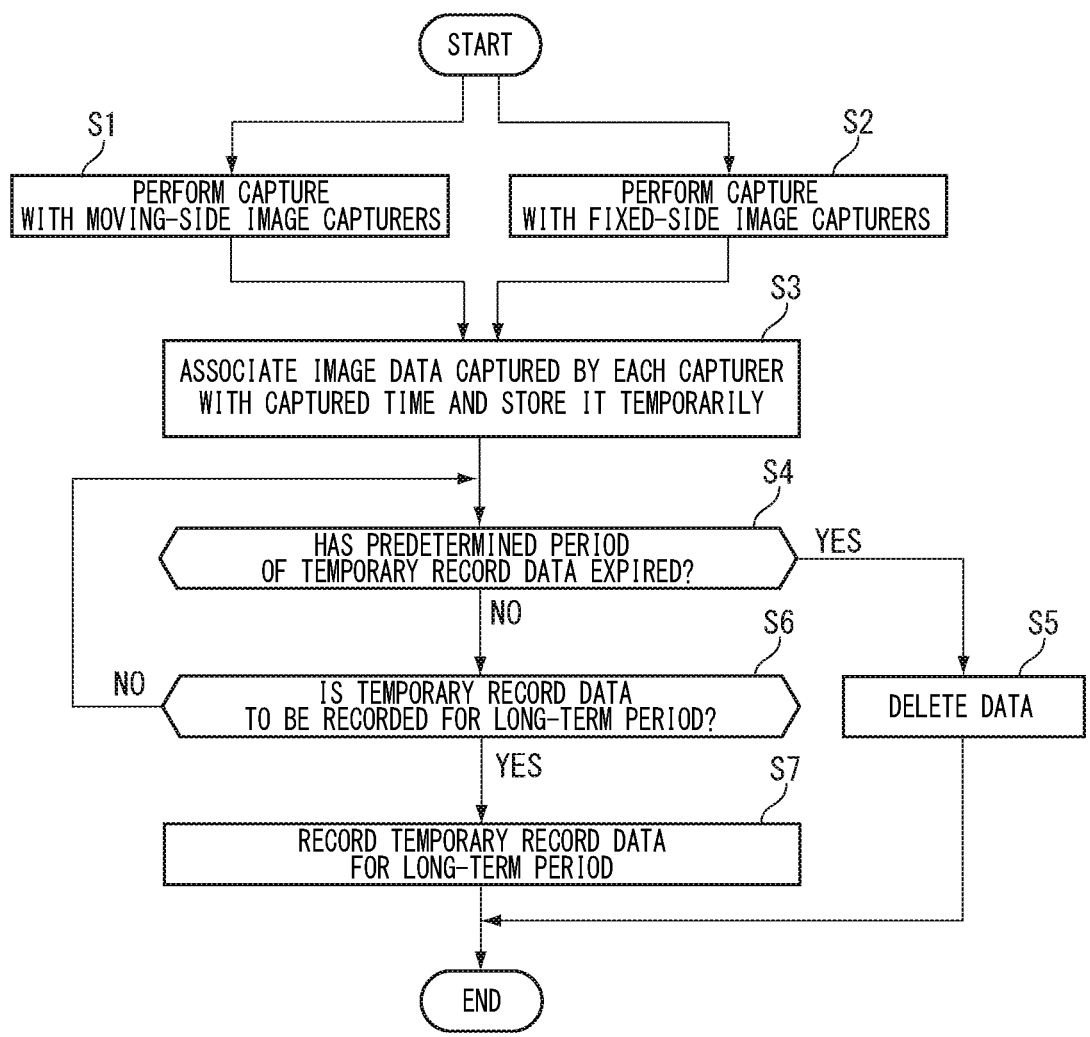
FIG. 11 is a flowchart showing an example of an operation of the automated warehouse.

Next, an operation of the automated warehouse S will be described. FIG. 11 is a flowchart showing an example of the operation of the automated warehouse S. As shown in FIG. 11, in Step S1, the moving-side image capturers 14 of the automated warehouse S image-capture a transfer destination and a part or all of an operation of transferring an article 2 to the transfer destination performed by the transporter 1, as described above. The image data captured by the moving-side image capturers 14 are output to the data bus 38.

Next, in Step S2, the fixed-side image capturers 8 image-capture the transfer destination and a part or all of the operation of transferring the article 2 to the transfer destination performed by the transporter 1, from a direction different from those of the moving-side image capturers 14, as described above. The image data captured by the fixed-side image capturers 8 are output to the data bus 38. Step S1 and Step S2 are performed, for example, at the same time or substantially at the same time.

Next, in Step S3, the controller 37 performs a controlling action so that the image data captured by the respective image capturers are each associated with a time of image-capturing performed by each image capturer, to be temporarily recorded in the recorder 36 for a predetermined period of time. For example, the controller 37 performs a controlling action so that the time of temporarily recording the image data in the recorder 36 is associated as a time of image-capturing performed by each image capturer, and the data are temporarily recorded in the recorder 36.

Next, in Step S4, the controller 37 determines whether or not a certain period of time has passed for the temporary record data. The controller 37 compares the time of image-capturing performed by each image capturer associated with the image data captured by each image capturer against the current time, and determines whether or not the certain period of time has passed for the temporary record data.

If the controller 37 determines the certain period of time as having passed for the temporary record data (YES in Step S4), the controller 37 performs a controlling action to delete the temporary record data from the recorder 36 in Step S5. If the controller 37 determines the certain period of time as having not passed for the temporary record data (NO in Step S4), then, in Step S6, the controller 37 determines whether or not the temporary record data meet a predetermined condition for recording for a long-term period.

If the controller 37 determines the temporary record data as not meeting the predetermined condition for recording for a long-term period (NO in Step S6), the process returns to Step S4. If the controller 37 determines the temporary record data as meeting the predetermined condition for recording for a long-term period (YES in Step S6), the controller 37 performs the process of Step S7. In Step S7, the controller 37 performs a controlling action to record the temporary record data in the recorder 36 as long-term record data and end the process. For example, the controller 37 performs a controlling action so that the long-term record data will not be deleted from the recorder 36 even when a certain period of time has passed from the time of recording. As a result, the operating personnel such as the operator can easily confirm the long-term record data recorded in the recorder 36 even when the certain period of time has passed.

As described above, in the automated warehouse S, it is possible to easily confirm, from multiple angles (directions), the transfer operation performed by the transporter.

Second Example

Figure 12:
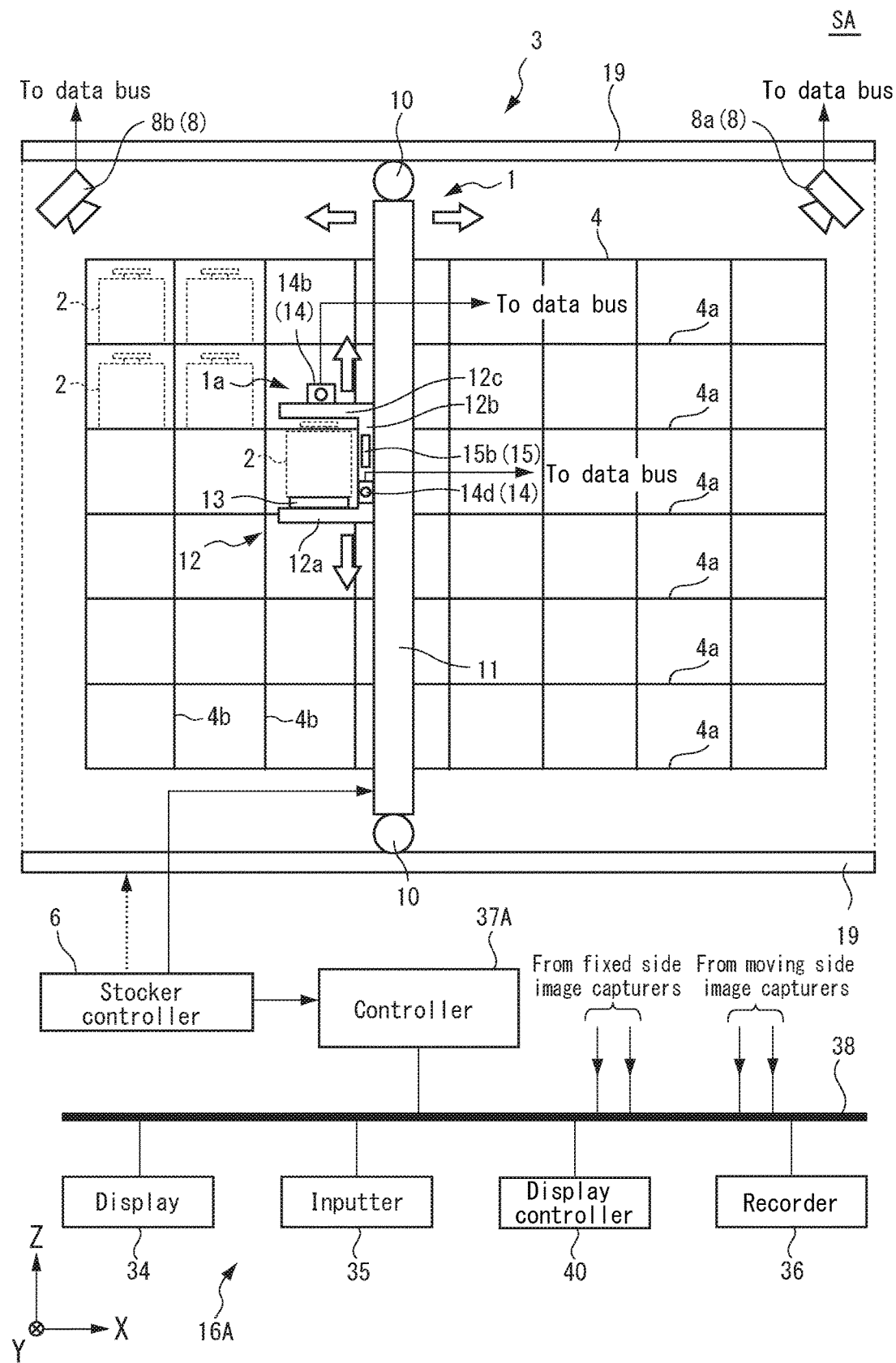
FIG. 12 is a front elevation view conceptually showing another example of an automated warehouse.

FIG. 12 is a front elevation view conceptually showing an automated warehouse SA according to a second example. In the automated warehouse SA, configurations of a controller 37A and a display controller 40 in a manager 16A differ from those in the manager 16 of the first example. The other configurations are the same as those of the first example, and are assigned with the same symbols and the descriptions thereof are omitted or simplified where appropriate. Hereinafter, differences from the first example will mostly be described.

As shown in FIG. 12, the manager 16A of the second example includes a display 34, an inputter 35, a recorder 36, a controller 37A, a display controller 40, and a data bus 38. The display 34, the inputter 35, the recorder 36, and the data bus 38 are the same as those of the first example, and the descriptions thereof are omitted or simplified where appropriate.

Figure 13:
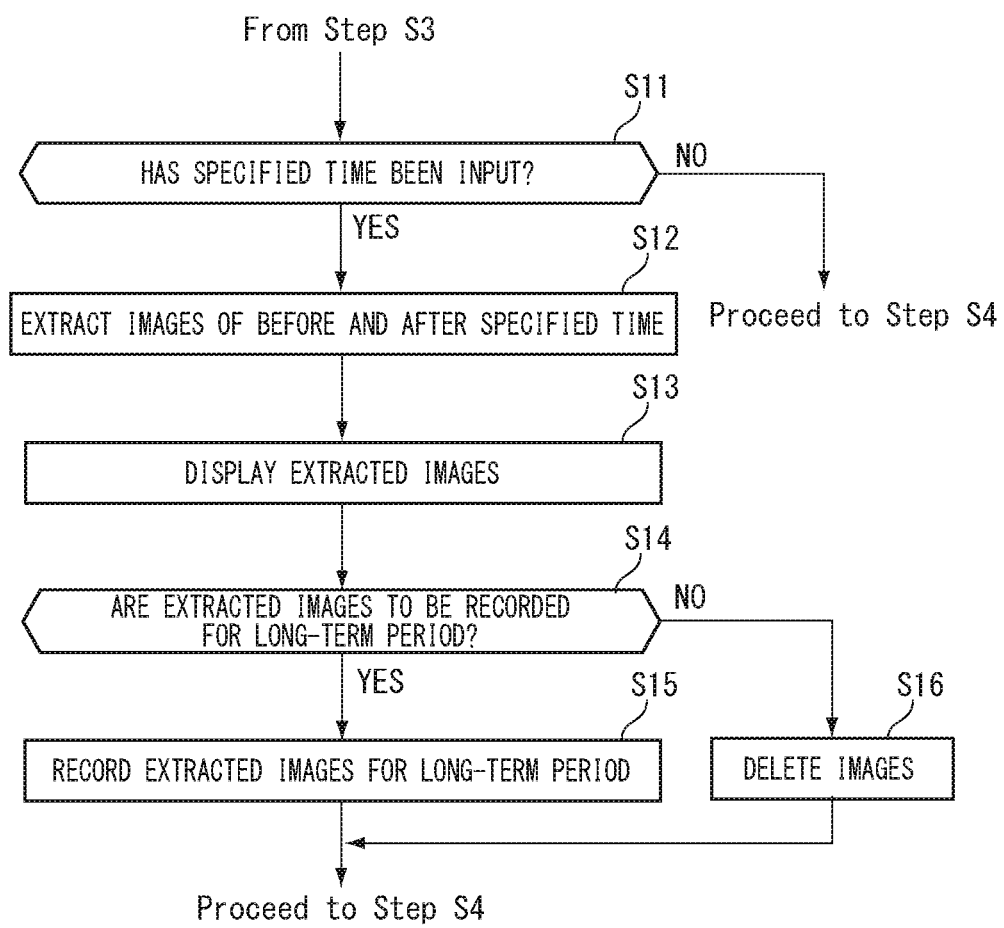
FIG. 13 is a flowchart showing an example of an operation of the automated warehouse.
Figure 14:
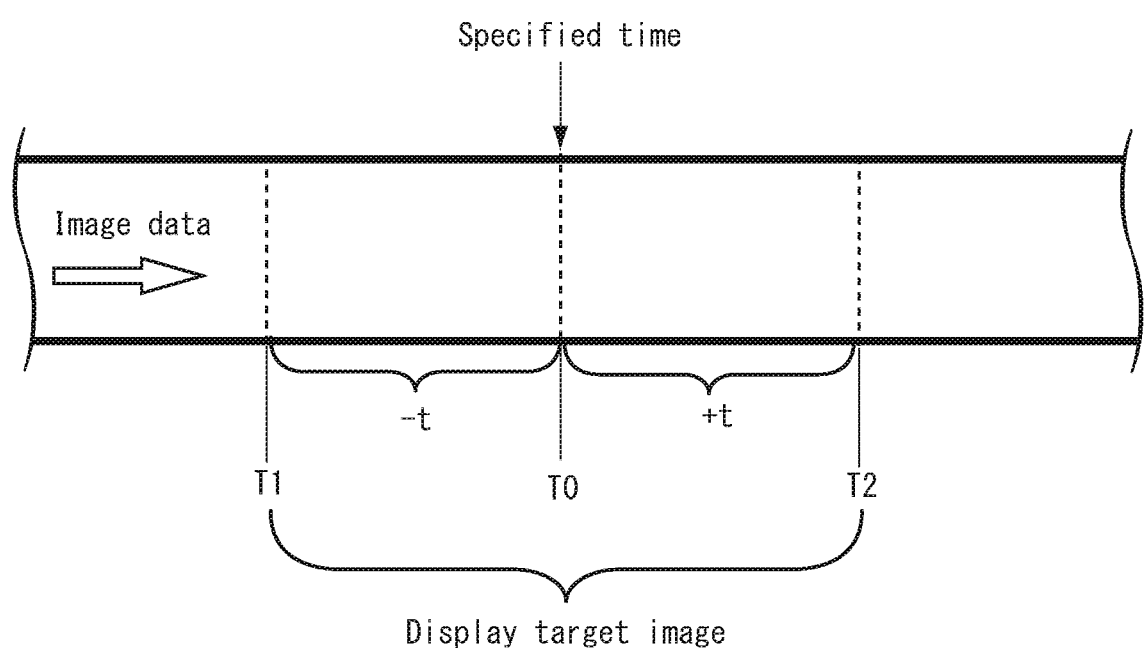
FIG. 14 is a diagram showing an example of an operation of a display controller.

FIG. 13 is a flowchart showing an example of an operation of the automated warehouse SA. FIG. 14 is a diagram showing an example of an operation of the display controller. Hereinafter, the controller 37A and the display controller 40 will be described with reference to the flowchart shown in FIG. 13.

As shown in FIG. 13, the automated warehouse SA performs the process of Step S11, which continues from Step S3 of the first example (see FIG. 11). In Step S11, the controller 37A determines whether or not an input of a specified time T0 for the display controller 40 to perform displaying (see FIG. 14) has been received from the stocker controller 6 or the inputter 35. For example, when an input of the abnormality signal described above is received from the stocker controller 6, the controller 37A determines the specified time T0 as having been input. In this example, the controller 37A sets the time, at which the input of the abnormality signal was received from the stocker controller 6, as the specified time T0. Also, when the inputter 35 receives an input of the specified time T0 from the operator, the controller 37A determines the specified time T0 as having been input.

In Step S11, if the controller 37A determines the specified time T0 as having not been input (NO in Step S11), the controller 37A performs the process of Step S4 shown in FIG. 11. In Step S11, if the controller 37A determines the specified time T0 as having been input (YES in Step S11), the controller 37A performs the process of Step S12. In Step S12, the display controller 40 extracts, from the recorder 36, image data of before and after the specified time T0. At this time, the image data extracted by the display controller 40 may be temporary record data or long-term record data. For example, as shown in FIG. 14, the display controller 40 extracts, from the recorder 36, image data in predetermined time ranges (from time T1 to time T2) before and after the specified time T0 (from −t to +t) specified by the stocker controller 6 controlling the automated warehouse SA or by the inputter 35. The predetermined times +t and −t may each be optionally set.

Next, in Step S13, the display controller 40 displays, on the display 34, the image data from the range between the time T1 and the time T2 extracted in Step S12. As a result, when an abnormality occurs in the automated warehouse SA, or by displaying the image data of a desired time on the display 34, an operating personnel such as the operator can confirm the image data easily.

Next, in Step S14, the controller 37A determines whether or not to record the extracted image for a long-term period. If an input of an operation instruction for not recording for a long-term period is received from the inputter 35, the controller 37A determines not to record the extracted image for a long-term period (NO in Step S14), and performs a controlling action in Step S16 to delete the extracted image without recording the extracted image in the recorder 36. Thereafter, Step S4 shown in FIG. 11 is performed.

If an input of an operation instruction for recording for a long-term period is received from the inputter 35, the controller 37A determines to record the extracted image for a long-term period (YES in Step S14), and performs the process of Step S15. In Step S15, the controller 37A performs a controlling action so that the extracted image is recorded in the recorder 36 as a long-term record. Then, Step S4 shown in FIG. 11 is performed.

As described above, in the automated warehouse SA of the second example, the display controller 40 extracts, from the recorder 36, image data in the predetermined time ranges (from time T1 to time T2) before and after the specified time T0 (from −t to +t) specified by the stocker controller 6 controlling the automated warehouse SA or by the inputter 35, and displays the image data on the display 34. Therefore, the motion image or the still image in the predetermined time ranges can be extracted and displayed. As a result, it is possible to easily confirm the image data captured by the fixed-side image capturers 8 and the moving-side image capturers 14 within the desired time ranges.

The technical scope of this disclosure is not limited to the examples described above. One or more of the requirements described in the above examples may be omitted as desired. Also, the requirements described in the above examples may be appropriately combined.

The contents of Japanese Patent Application No. 2016-198634 and all documents cited in the detailed description are incorporated herein by reference.

For example, the transporter 1 shown in FIG. 1 in the examples described above is merely an example, and another configuration may be employed. For example, the number of the mast 11 of the transporter 1 is not limited to one, and may be two.

The invention claimed is:

1. An automated warehouse including a plurality of transfer destinations at which articles can be placed and a transporter that moves between the plurality of transfer destinations and transfers the article to the transfer destination, the automated warehouse comprising:
  a moving-side image capturer provided on the transporter and image-captures the transfer destination and a part or all of an operation of transferring the article to the transfer destination performed by the transporter; and
  a fixed-side image capturer provided at a predetermined position in the automated warehouse, and image-captures, from a direction different from that of the moving-side image capturer, the transporter and a part or all of the operation of transferring the article to the transfer destination performed by the transporter,
  wherein the transporter includes: a main body that moves between the plurality of transfer destinations; and a transferer provided on the main body and delivers or receives the article to or from the transfer destination,
  the moving-side image capturer is provided on the main body while being oriented in a direction in which the transferer delivers or receives the article, and image-captures the interior of each transfer destination,
  the fixed-side image capturer is provided while being oriented toward the interior of the automated warehouse from each traveling end side of the transporter, and image-captures the transporter moving between the plurality of transfer destinations,
  the fixed-side image capturer is arranged on an upper side of the automated warehouse and a traveling end side of the transporter, and image-captures, from diagonally above, an interior of the automated warehouse including the transporter, and
  an image area of the moving-side image capturer and an image area of the fixed-side image capturer overlap.

2. The automated warehouse according to claim 1, further comprising a display that displays a motion image or a still image captured by at least one of the moving-side image capturer and the fixed-side image capturer.

3. The automated warehouse according to claim 2, wherein the display is capable of simultaneously displaying, in a side-by-side manner, motion images or still images captured by the moving-side image capturer and the fixed-side image capturer.

4. The automated warehouse according to claim 2, further comprising a recorder that records a motion image or a still image captured by at least one of the moving-side image capturer and the fixed-side image capturer.

5. The automated warehouse according to claim 4, wherein the motion image or the still image is associated with a time of image-capturing and recorded in the recorder.

6. The automated warehouse according to claim 4, further comprising a display controller that extracts, from the recorder, a motion image or a still image within predetermined time ranges before and after a specified time that is specified by a controller controlling the automated warehouse or by an inputter, and that causes the display to display the motion image or the still image.

7. The automated warehouse according to claim 1, wherein the moving-side image capturer is supported on an elevation platform lifted or lowered while having the article placed thereon, and image-captures the transfer destination from diagonally above.

8. The automated warehouse according to claim 7, further comprising an illuminator provided on the elevation platform and illuminates the transfer destination when the moving-side image capturer performs image-capturing.

9. The automated warehouse according to claim 3, further comprising a recorder that records a motion image or a still image captured by at least one of the moving-side image capturer and the fixed-side image capturer.

10. The automated warehouse according to claim 5, further comprising a display controller that extracts, from the recorder, a motion image or a still image within predetermined time ranges before and after a specified time that is specified by a controller controlling the automated warehouse or by an inputter, and that causes the display to display the motion image or the still image.

11. The automated warehouse according to claim 2, wherein the moving-side image capturer is supported on an elevation platform lifted or lowered while having the article placed thereon, and image-captures the transfer destination from diagonally above.

12. The automated warehouse according to claim 3, wherein the moving-side image capturer is supported on an elevation platform lifted or lowered while having the article placed thereon, and image-captures the transfer destination from diagonally above.

13. The automated warehouse according to claim 4, wherein the moving-side image capturer is supported on an elevation platform lifted or lowered while having the article placed thereon, and image-captures the transfer destination from diagonally above.

14. The automated warehouse according to claim 5, wherein the moving-side image capturer is supported on an elevation platform lifted or lowered while having the article placed thereon, and image-captures the transfer destination from diagonally above.

15. The automated warehouse according to claim 6, wherein the moving-side image capturer is supported on an elevation platform lifted or lowered while having the article placed thereon, and image-captures the transfer destination from diagonally above.

16. The automated warehouse according to claim 2, wherein the fixed-side image capturer is arranged on an upper side of the automated warehouse and a traveling end side of the transporter, and image-captures, from diagonally above, an interior of the automated warehouse including the transporter.

17. The automated warehouse according to claim 3, wherein the fixed-side image capturer is arranged on an upper side of the automated warehouse and a traveling end side of the transporter, and image-captures, from diagonally above, an interior of the automated warehouse including the transporter.

18. The automated warehouse according to claim 4, wherein the fixed-side image capturer is arranged on an upper side of the automated warehouse and a traveling end side of the transporter, and image-captures, from diagonally above, an interior of the automated warehouse including the transporter.

19. The automated warehouse according to claim 5, wherein the fixed-side image capturer is arranged on an upper side of the automated warehouse and a traveling end side of the transporter, and image-captures, from diagonally above, an interior of the automated warehouse including the transporter.

* * * * *